(12) United States Patent
Lee et al.

(10) Patent No.: US 12,538,505 B2
(45) Date of Patent: Jan. 27, 2026

(54) CAPACITOR AND ELECTRONIC DEVICE INCLUDING THE SAME

(71) Applicant: Samsung Electronics Co., Ltd., Suwon-si (KR)

(72) Inventors: Changsoo Lee, Suwon-si (KR); Jinhong Kim, Suwon-si (KR); Yong-Hee Cho, Suwon-si (KR); Cheheung Kim, Suwon-si (KR); Jooho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 341 days.

(21) Appl. No.: 18/168,068

(22) Filed: Feb. 13, 2023

(65) Prior Publication Data
US 2024/0105764 A1   Mar. 28, 2024

(30) Foreign Application Priority Data
Sep. 27, 2022  (KR) .......................... 10-2022-0122870

(51) Int. Cl.
*H10D 1/68* (2025.01)
*H10B 12/00* (2023.01)

(52) U.S. Cl.
CPC ............. *H10D 1/696* (2025.01); *H10B 12/31* (2023.02); *H10B 12/34* (2023.02)

(58) Field of Classification Search
CPC ......... H10D 1/696; H10B 12/31; H10B 12/34
See application file for complete search history.

(56) References Cited

U.S. PATENT DOCUMENTS

| | | | |
|---|---|---|---|
| 6,107,105 A * | 8/2000 | Sandhu | H10B 12/377 257/E27.094 |
| 6,191,443 B1 | 2/2001 | Al-Shareef et al. | |
| 2013/0037913 A1 | 2/2013 | Chen et al. | |
| 2013/0072015 A1 | 3/2013 | Chen et al. | |
| 2013/0155572 A1* | 6/2013 | Popovici | H10D 1/684 427/532 |
| 2015/0137315 A1 | 5/2015 | Chen et al. | |

(Continued)

FOREIGN PATENT DOCUMENTS

| | | |
|---|---|---|
| EP | 1628328 A2 | 2/2006 |
| EP | 2608250 A2 | 6/2013 |
| KR | 10-2013-0092001 A | 8/2013 |

(Continued)

OTHER PUBLICATIONS

Seong Keun Kim et al., "Impact of Bimetal Electrodes on Dielectric Properties of TiO2 and Al-Doped TiO2 Films," ACS Appl. Mater. Interfaces, Aug. 6, 2012, 4, pp. 4726?4730.

(Continued)

*Primary Examiner* — Richard A Booth
(74) *Attorney, Agent, or Firm* — Harness, Dickey & Pierce, P.L.C.

(57) ABSTRACT

A capacitor includes a lower electrode, an upper electrode disposed to face the lower electrode, and a dielectric layer between the lower electrode and the upper electrode. The lower electrode includes a first lower electrode layer apart from the dielectric layer and a second lower electrode layer between the first lower electrode layer and the dielectric layer. The second lower electrode layer includes vanadium oxide.

16 Claims, 25 Drawing Sheets

(56) References Cited

U.S. PATENT DOCUMENTS

2021/0305358 A1 9/2021 Naskar et al.
2023/0080072 A1 3/2023 Kim et al.

FOREIGN PATENT DOCUMENTS

| KR | 10-1892632 B1 | 10/2018 |
| KR | 2021-0087642 A | 7/2021 |
| KR | 10-2023-0039440 A | 3/2023 |

OTHER PUBLICATIONS

Woojin Jeon, "Recent advances in the understanding of high-k dielectric materials deposited by atomic layer deposition for dynamic random-access memory capacitor applications," Journal of Materials Research, <https://url.us.m.mimecastprotect.com/s/A6WcCERZ81H6InwViNj_XR?domain=cambridge.org>7,14, Nov. 11, 2019.

Seong Keun Kim et al., "Capacitors with an Equivalent Oxide Thickness of < 0.5 nm for Nanoscale Electronic Semiconductor Memory," Adv. Funct. Mater., Aug. 23, 2010, vo. 20, pp. 2989-3003.

Seong Keun Kim et al., "High dielectric constant TiO2 thin films on a Ru electrode grown; at 250 ° C. by atomic-layer deposition," Applied Physics Letters, vol. 85, No. 18, 2004.

Cheol Jin Cho et al., "Ta-doped SnO2 as a Reduction-Resistant Oxide Electrode for DRAM Capacitors," J. Mater. Chem. C, Aug. 22, 2017, Vo.5, pp. 9405-9411.

Mark T. Greiner et al., "Transition Metal Oxide Work Functions: The Influence of Cation Oxidation State and Oxygen Vacancies," Adv. Funct. Mater., May 2012, vol. 22, pp. 4557-4568.

Extended European Search Report issued Aug. 11, 2023 in European Application No. 23159080.3.

Notice of Non-Final Rejection issued Nov. 19, 2023 in Korean Application No. 10-2022- 0122870.

CJ Cho et al., "Ta-Doped SnO2 as a reduction-resistant oxide electrode for DRAM capacitors,", Journal of Materials Chemistry C, pp. 9405~9411, Issue 36, Aug. 22, 2017.

* cited by examiner

CAPACITOR AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2022-0122870, filed on Sep. 27, 2022, in the Korean Intellectual Property Office, the disclosure of which is incorporated by reference herein in its entirety.

BACKGROUND

1. Field

The disclosure relates to capacitors and electronic devices including the same.

2. Description of the Related Art

As the degree of integration of electronic devices, such as memories, increases, electronic elements in the electronic devices are becoming more miniaturized. However, because capacitance of a capacitor is proportional to the area of the capacitor, the capacitance may decrease as the capacitor is miniaturized. Therefore, in order to compensate for the decrease in size of a capacitor and secure a desired capacitance, studies have been conducted into further increasing a dielectric constant of a dielectric layer. In addition, studies have been conducted on suppressing an increase in leakage current due to miniaturization of capacitors.

SUMMARY

Provided are capacitors with a dielectric layer including a high-κ dielectric material, and electronic devices including the same.

Provided are capacitors having a lower electrode structure suitable for forming a dielectric layer of a high-κ dielectric material, and electronic devices including the same.

Provided are capacitors with improved leakage current characteristics and electronic devices including the same.

Additional aspects will be set forth in part in the description which follows and, in part, will be apparent from the description, and/or may be learned by practice of the presented example embodiments of the disclosure.

According to an aspect of at least one embodiment, a capacitor includes: a lower electrode; an upper electrode facing the lower electrode; and a dielectric layer separating the lower electrode and the upper electrode, wherein the lower electrode includes a first lower electrode layer spaced apart from the dielectric layer and a second lower electrode layer separating the first lower electrode layer and the dielectric layer, and the second lower electrode layer includes vanadium oxide.

The vanadium oxide of the second lower electrode layer may include a crystal of at least one of, for example, $VO_2$, $V_2O_5$, or $VO_3$.

The second lower electrode layer may be doped with at least one of, for example, tungsten (W), tantalum (Ta) or niobium (Nb).

The second lower electrode layer may have a thickness of, for example, 10 nm or less.

The first lower electrode layer may include at least one of, for example, TiN, VN, MoN, and $SnO_2$.

The $SnO_2$ may include at least one dopant selected from, for example, tungsten (W), tantalum (Ta), niobium (Nb), antimony (Sb), manganese (Mn), fluorine (F), $RuO_2$, $IrO_2$, or $MoO_2$ as a dopant.

The dopant in the first lower electrode layer may be included in an amount (x) such that 0.01 at %≤x≤10 at %.

The dielectric layer may include $TiO_2$ having a rutile phase.

The dielectric layer may include at least one of, for example, gallium (Ga), aluminum (Al), lanthanum (La), boron (B), indium (In), scandium (Sc), or yttrium (Y), in an amount (y) such that 0 at %<y≤10 at %.

The dielectric layer may have a thickness of, for example, 20 nm or less.

The dielectric layer may have a dielectric constant of, for example, 50 or more.

According to an aspect of at least one embodiment, an electronic device includes: a transistor; and a capacitor electrically connected to the transistor, wherein the capacitor includes a lower electrode, an upper electrode facing the lower electrode, and a dielectric layer separating the lower electrode and the upper electrode, wherein the lower electrode includes a first lower electrode layer spaced apart from the dielectric layer and a second lower electrode layer separating the first lower electrode layer and the dielectric layer, and the second lower electrode layer includes vanadium oxide.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
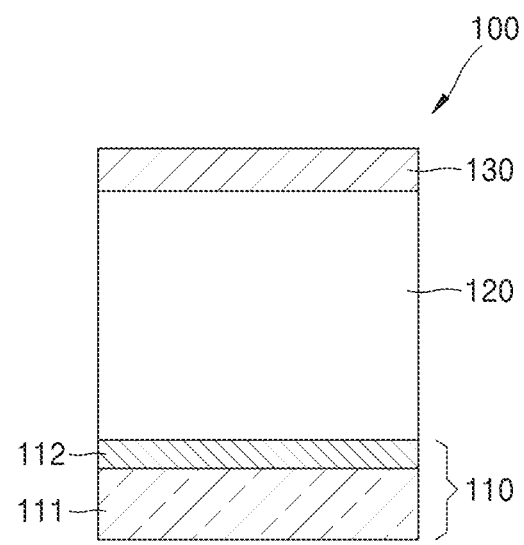
FIG. 1 is a cross-sectional view illustrating a schematic structure of a capacitor, according to at least one embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a capacitor and an electronic device including the same will be described in detail with reference to the accompanying drawings. In the following drawings, the size of each element in the drawings may be exaggerated for clarity and convenience of explanation. In addition, embodiments described herein are merely examples, and various modifications may be made thereto from these embodiments.

Hereinafter, the terms "above" or "on" may include not only those that are directly on in a contact manner, but also those that are above in a non-contact manner unless explicitly described as otherwise. In addition, it will be understood that these, and other similar, spatially relative terms are intended to encompass different orientations in addition to the orientation depicted in the figures. For example, if the device in the figures is otherwise oriented (e.g., rotated 90 degrees or at other orientations), the spatially relative descriptors used herein are to be interpreted accordingly. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

The use of the term "the" and similar demonstratives may correspond to both the singular and the plural. Operations constituting methods may be performed in any suitable order unless otherwise indicated herein or otherwise clearly contradicted by context, and are not necessarily limited to the stated order.

Also, the terms such as " . . . er/or", "module" and/or otherwise directed towards functional elements, as described in the specification, mean units that process at least one function or operation, and may be implemented as (and/or in) processing circuitry such as hardware, software, or a combination of hardware and software. For example, the processing circuitry more specifically may be and/or include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), electrical components (such as at least one of transistors, resistors, capacitors, logic gates (including at least one of AND gates, OR gates, NOR gates, NAND gates, NOT gates, XOR gates, etc.), and/or the like), etc.

Connecting lines or connecting members illustrated in the drawings are intended to represent exemplary functional relationships and/or physical or logical connections between the various elements. It should be noted that many alternative or additional functional relationships, physical connections or logical connections may be present in a practical device.

The use of all illustrations or illustrative terms in the embodiments is simply to describe the technical ideas in detail, and the scope of the disclosure is not limited by the illustrations or illustrative terms unless they are limited by claims.

FIG. 1 is a cross-sectional view illustrating a schematic structure of a capacitor 100, according to at least one embodiment. Referring to FIG. 1, the capacitor 100 may include a lower electrode 110, an upper electrode 130 disposed to face the lower electrode 110, a dielectric layer 120 located between the lower electrode 110 and the upper electrode 130. In at least one embodiment, during the process of manufacturing the capacitor 100, the dielectric layer 120 may be formed on the upper surface of the lower electrode 110, and the upper electrode 130 may be formed on the upper surface of the dielectric layer 120.

The dielectric layer 120 may include, for example, rutile phase of titanium oxide ($TiO_2$). $TiO_2$ has a different dielectric constant depending on the phase and/or orientation of the $TiO_2$ phase. For example, while the anatase phase $TiO_2$ has a dielectric constant of about 40, the rutile phase $TiO_2$ may have a great dielectric constant of about 80 to about 170 depending on a growth direction thereof. Accordingly, the dielectric layer 120 including $TiO_2$ may have a dielectric constant ($\kappa$) of not less than 80 and not more than 170 (e.g., such that $80 \leq \kappa \leq 170$).

The dielectric layer 120 may include only $TiO_2$ or may include $TiO_2$ containing a dopant. For example, the dielectric layer 120 may include, as the dopant, at least one of gallium (Ga), aluminum (Al), lanthanum (La), boron (B), indium (In), scandium (Sc), yttrium (Y), and/or the like. For example, when the dielectric layer 120 includes the dopant, an amount of the dopant ("y") in the dielectric layer 120, when represented by an atomic percentage ("at %"), may be not less than 0 at % and not more than 10 at % (e.g., such that 0 at %<y≤10 at %), together with $TiO_2$. Although rutile phase $TiO_2$ exhibits a high dielectric constant, a bandgap of rutile phase $TiO_2$ may be as low as about 3 eV, and thus, rutile phase $TiO_2$ has a high leakage current. Accordingly, depending on the conditions of a capacitor including $TiO_2$ in the dielectric layer, it may be difficult to satisfy industry leakage current specification requirements when relying only on $TiO_2$. In these cases, the dopant contained in the dielectric layer 120 may improve leakage current characteristics of the dielectric layer 120 by increasing the bandgap of the dielectric layer 120. The dielectric constant of the dielectric layer 120 containing the dopant may be slightly reduced. For example, the dielectric layer 120 containing the dopant may have a dielectric constant of about 50 or more. For example, the dielectric layer 120 may have a dielectric constant (κ) of 50 or more, 80 or more, and/or 170 or less.

According to at least one embodiment, because the dielectric layer 120 has a high dielectric constant, the thickness of the dielectric layer 120 may be reduced and the capacitor 100 may be further miniaturized. For example, in at least one embodiment, the dielectric layer 120 may have a thickness of about 20 nm or less. Alternatively, the dielectric layer 120 may have a thickness of about 15 nm or less, or about 10 nm or less.

The lower electrode 110 may be configured to enable (and/or promote) the rutile phase growth of the dielectric layer 120 grown thereon and to reduce a leakage current. According to at least one embodiment, the lower electrode 110 may include a first lower electrode layer 111 spaced apart from the dielectric layer 120 and a second lower electrode layer 112 between the first lower electrode layer 111 and the dielectric layer 120. For example, in the process of manufacturing the capacitor 100, the second lower electrode layer 112 may be formed on the upper surface of the first lower electrode layer 111, and the dielectric layer 120 may be formed on the upper surface of the second lower electrode layer 112.

A material of the first lower electrode layer 111 may be selected to ensure conductivity as an electrode and to maintain stable capacitance performance even after a high-temperature process (e.g., 350° C. or higher and/or 400° C. or higher) performed during the manufacturing of the capacitor 100. In addition, in at least one embodiment, the first lower electrode layer 111 may include a crystalline conductive material so that rutile phase $TiO_2$ having a high dielectric constant in the dielectric layer 120 is easily formed on the lower electrode 110. For example, the first lower electrode layer 111 may include at least one of a conductive transition metal oxide or a conductive transition metal nitride (such as at least one of titanium nitride (TiN) vanadium nitride (VN), molybdenum nitride (MoN), tin oxide ($SnO_2$), and/or the like). In at least one embodiment, the first lower electrode layer 111 may include, for example, $SnO_2$ doped with a dopant including a metal or a metal oxide. The dopant may include at least one of tungsten (W), tantalum (Ta), niobium (Nb), antimony (Sb), manganese (Mn), fluorine (F), $RuO_2$, $IrO_2$, $MoO_2$, and/or the like. In at least one embodiment, the dopant in the first lower electrode layer 111 may be included in an amount ("x") not less than 0.01 at % and not more than 10 at %, such that 0.01 at %≤x≤10 at %. In the first lower electrode layer 111 including $SnO_2$, the dopant may improve chemical stability of $SnO_2$ at room temperature by lowering the possibility that the Sn component in the first lower electrode layer 111 will be reduced to a metal and/or by preventing (or minimizing) a decrease in electrical conductivity of the first lower electrode layer 111. In at least one embodiment, the first lower electrode layer 111 may have a thickness of, for example, about 20 nm or less.

A material of the second lower electrode layer 112 may be selected to reduce the leakage current of the dielectric layer 120. To this end, in order to prevent (or minimize) the movement of oxygen ions of the first lower electrode layer 111 to the dielectric layer 120, the second lower electrode layer 112 may include a transition metal oxide having an oxygen chemical potential between the oxygen chemical potential of the first lower electrode layer 111 and the oxygen chemical potential of the dielectric layer 120. In these cases, a decrease in the work function of the first lower electrode layer 111 (e.g., due to the reduction of the transition metal in the first lower electrode layer 111) may be prevented (or minimized). Like the first lower electrode layer 111, the material of the second lower electrode layer 112 may be selected to ensure conductivity as an electrode, to maintain stable capacitance performance even after a high-temperature process performed during the manufacturing of the capacitor 100, and to enable rutile phase $TiO_2$ to be formed thereon.

According to at least one embodiment, the second lower electrode layer 112 may include a crystal (or crystalline phase) of vanadium oxide ($V_aO_b$), wherein a ratio (b:a) is 2 or more and/or 3 or less. For example, the second lower electrode layer 112 may include a crystal of at least one of $VO_2$, $V_2O_5$, and/or $VO_3$. The work function of the second lower electrode layer 112 may increase as the oxygen ratio in the vanadium oxide increases. When the second lower electrode layer 112 includes vanadium oxide, a leakage current may be limited by securing a conduction band offset (CBO) of about 1 eV or more, for example, about 1.25 eV or more, between the lower electrode 110 and the dielectric layer 120. In addition, even when some oxygen atoms in vanadium oxide move to the $TiO_2$ in the dielectric layer 120 and/or when oxygen vacancies exist in vanadium oxide, vanadium oxide maintains a stable state. Additionally, in at least one embodiment, the vanadium oxide may be doped in order to further improve oxygen stability of vanadium oxide in the second lower electrode layer 112. For example, the dopant in the second lower electrode layer 112 may include at least one of tungsten (W), tantalum (Ta), niobium (Nb), and/or the like. In at least one embodiment, because $TiO_2$ in the dielectric layer 120 has an n-type property, a leakage current may be further improved when additional oxygen is supplied thereto.

A leakage current decreases as the thickness of the second lower electrode layer 112 increases. However, to miniaturize the capacitor 100, the thickness of the second lower electrode layer 112 may be less than the thickness of the first lower electrode layer 111. For example, the thickness of the second lower electrode layer 112 may be about 10 nm or less, 5 nm or less, and/or 4 nm or less. Even when vanadium oxide in the second lower electrode layer 112 exists as only one molecular layer, rutile $TiO_2$ may be grown thereon.

The upper electrode 130 includes a conductive material. Like the lower electrode 110, the upper electrode 130 may have a rutile phase, and/or may include various conductive materials having phases other than the rutile phase. The upper electrode 130 may include at least one of a metal, a metal nitride, a metal oxide, or any combination thereof. For example, the upper electrode 130 may include at least one of TiN, MoN, cobalt nitride (CoN), tantalum nitride (TaN), tungsten (W), ruthenium (Ru), $RuO_2$, strontium ruthenate ($SrRuO_3$ (SRO)), Ir (iridium), iridium oxide ($IrO_2$), platinum (Pt), PtO, barium substituted SRO (($Ba,Sr)RuO_3$ (B SRO)), calcium ruthenate ($CaRuO_3$ (CRO)), lanthanum-strontium cobalt oxide (($La,Sr)CoO_3$ (LSCO)), a combination thereof, and/or the like.

Figure 2:
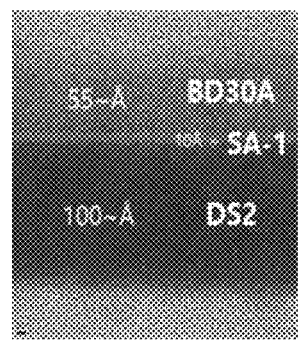
FIG. 2 shows a high resolution-transmission electron microscopy (HR-TEM) photograph of a capacitor manufactured to have the structure illustrated in FIG. 1.

FIG. 2 shows a high resolution-transmission electron microscopy (HR-TEM) photograph of a capacitor manufactured to have the structure illustrated in FIG. 1; and FIGS. 3A to 3D show elemental mapping results for the capacitor illustrated in FIG. 2. In FIG. 2, 'DS2' is the first lower electrode layer 111 including Ta-doped $SnO_2$ and having a thickness of 10 nm (100 Å), 'SA-1' is the second lower electrode layer 112 including VO$_2$ and having a thickness of 1 nm (10 Å), and 'BD30A' is the dielectric layer 120 including rutile phase TiO$_2$ and having a thickness of 5.5 nm (55 Å). Silicon was used as a substrate for forming the capacitor. The second lower electrode layer 112 was grown on the upper surface of the first lower electrode layer 111 by pulsed laser deposition (PLD). In addition, the dielectric layer 120 was grown on the upper surface of the second lower electrode layer 112 by atomic layer deposition (ALD).

Figure 3A:
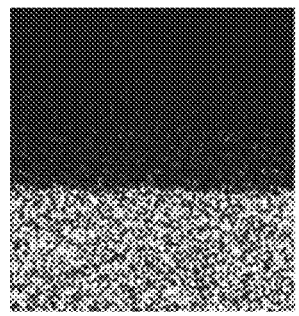
FIGS. 3A to 3D show elemental mapping results for the capacitor illustrated in FIG. 2.
Figure 3B:
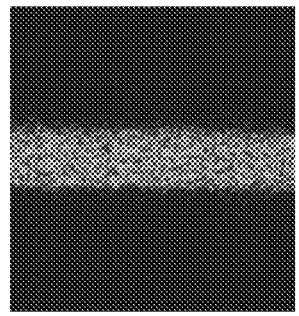
Figure 3C:
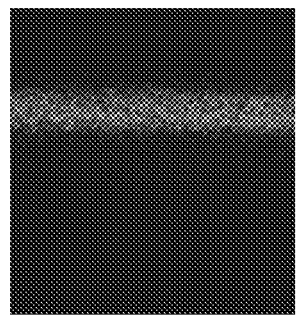
Figure 3D:
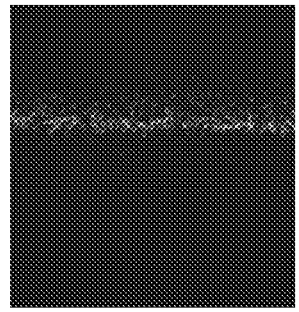

Referring to FIGS. 3A to 3D, FIG. 3A shows a distribution of a silicon (Si) element; FIG. 3B shows a distribution of a tin (Sn) element; FIG. 3C shows a distribution of a titanium (Ti) element; and FIG. 3D shows a distribution of a vanadium (V) element. Referring to FIGS. 2 and 3A to 3D, it may be confirmed that the rutile phase dielectric layer 120 having a homogeneous crystal structure is grown on the second lower electrode layer 112 including vanadium oxide. In addition, referring to FIGS. 3A to 3D, it may be confirmed that there is almost no inter-diffusion problem between the second lower electrode layer 112 including vanadium oxide and the dielectric layer 120 including TiO$_2$.

Figure 4:
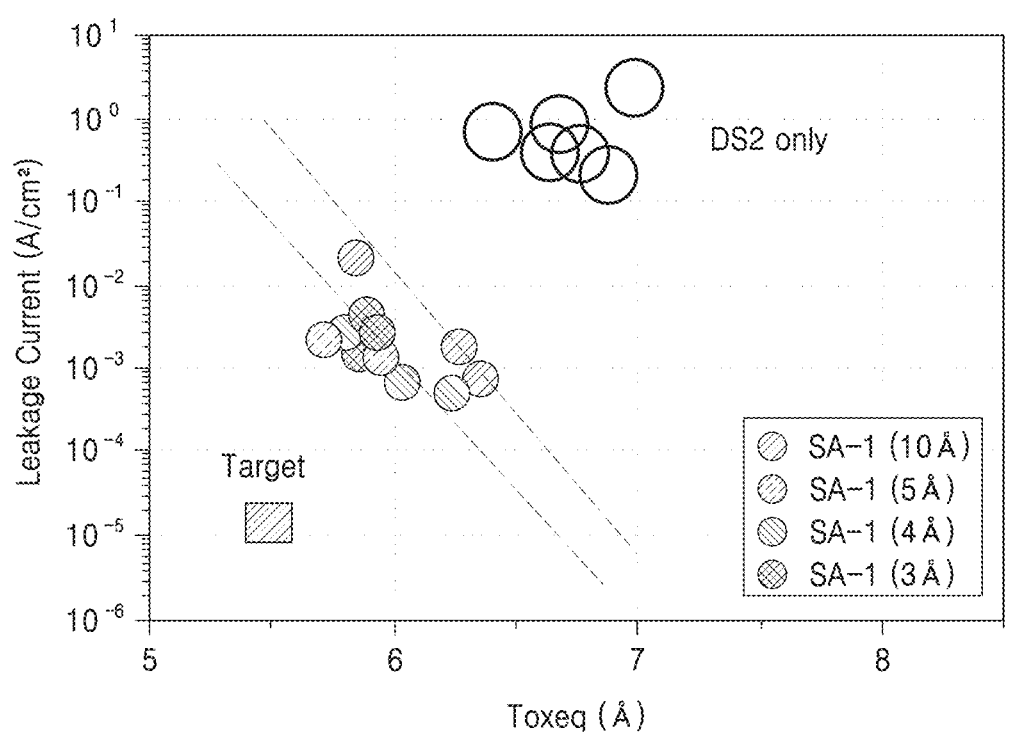
FIG. 4 is a graph showing a comparison between leakage current characteristics of capacitors according to some examples and a comparative example.

FIG. 4 is a graph showing a comparison between leakage current characteristics of capacitors according to some examples and a comparative example. In the graph of FIG. 4, the vertical axis represents a leakage current and the horizontal axis represents an equivalent oxide thickness (Toxeq or EOT). In addition, 'DS2 only' in FIG. 4 represents a comparative example of a capacitor including the first lower electrode layer 111 and not the second lower electrode layer 112. In the examples, a plurality of capacitors in which the second lower electrode layer 112 included VO$_2$ having a thickness 0.3 nm (3 Å), 0.4 nm (4 Å), 0.5 nm (5 Å), and 1 nm (10 Å) were manufactured and tested. In the comparative example and the examples, the first lower electrode layer 111 includes Ta-doped SnO$_2$. Referring to FIG. 4, it may be confirmed that in the case of the examples, the equivalent oxide thickness is reduced and the leakage current is also reduced, compared to the comparative example.

Figure 5:
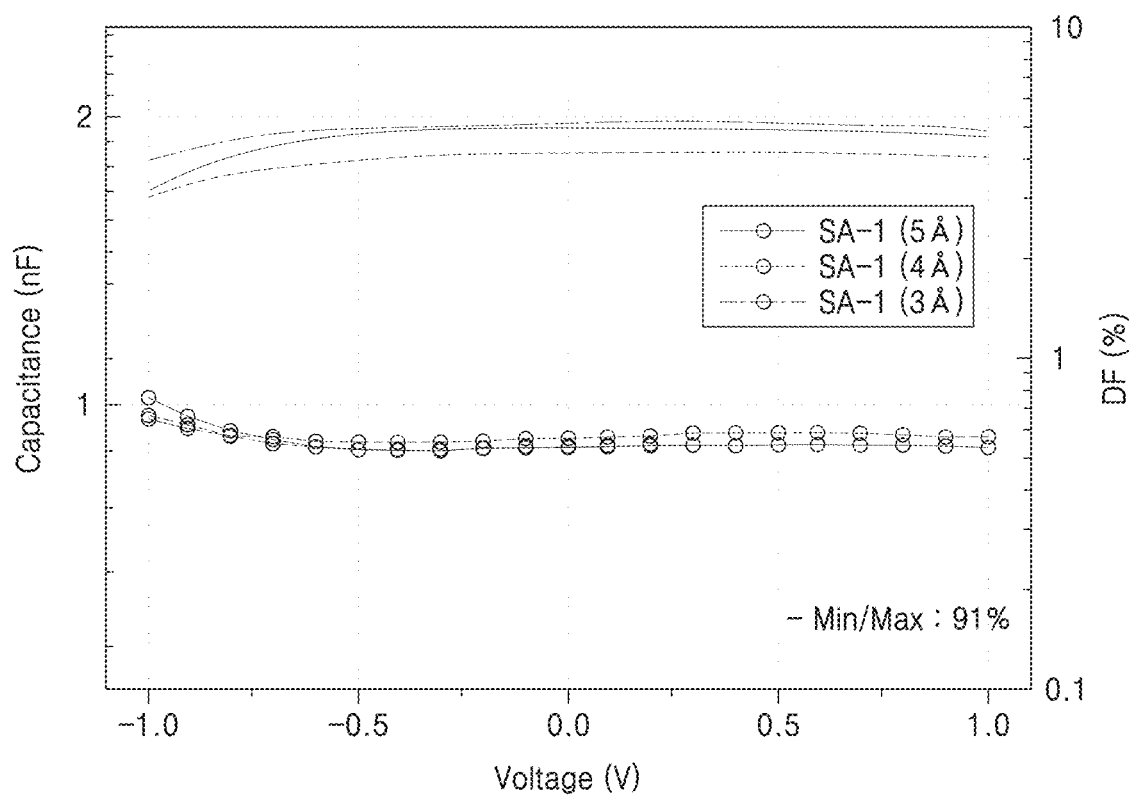
FIG. 5 shows capacitance-voltage (C-V) curves of capacitors according to some examples.

FIG. 5 shows capacitance-voltage (C-V) curves of the capacitors according to the examples. In FIG. 5, the right vertical axis represents a dissipation factor (DF) that is indicated by the circles ('∘'), and the left vertical axis represents capacitance that is indicated only by the line segments. As the examples, a plurality of capacitors in which the first lower electrode layer 111 included Ta-doped SnO$_2$ and the second lower electrode layer 112 included VO$_2$ having a thickness of 0.3 nm, 0.4 nm, and 0.5 nm were manufactured and tested. Referring to FIG. 5, in the examples, a capacitance and the dissipation factor showed stable values without a significant change with respect to an applied voltage. In addition, the dissipation factor was maintained relatively low. As the dissipation factor increases, the leakage current increases. In the examples, it may be confirmed that low leakage current characteristics are exhibited regardless of an applied voltage.

Figure 6:
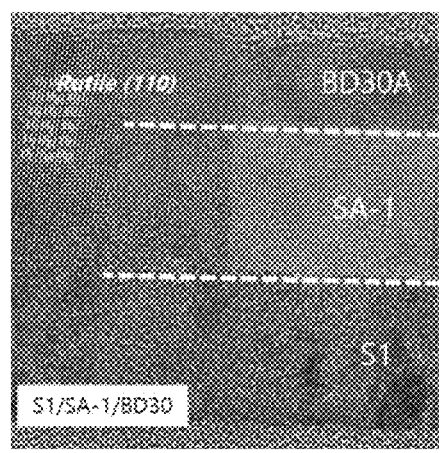
FIG. 6 shows an HR-TEM photograph of another manufactured capacitor.

FIG. 6 shows an HR-TEM photograph of another manufactured capacitor; and FIGS. 7A to 7E show elemental mapping results for the capacitor illustrated in FIG. 6. In FIG. 6, 'S1' represents the first lower electrode layer 111 including TiN, 'SA-1' represents the second lower electrode layer 112 including VO$_2$, and 'BD30A' represents the dielectric layer 120 including rutile phase TiO$_2$. Silicon was used as a substrate for forming the capacitor. The second lower electrode layer 112 was grown on the upper surface of the first lower electrode layer 111 by PLD, and the dielectric layer 120 was grown on the upper surface of the second lower electrode layer 112 by ALD.

Figure 7A:
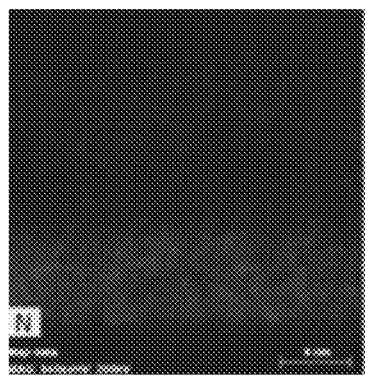
FIGS. 7A to 7E show elemental mapping results for the capacitor illustrated in FIG. 6.
Figure 7B:
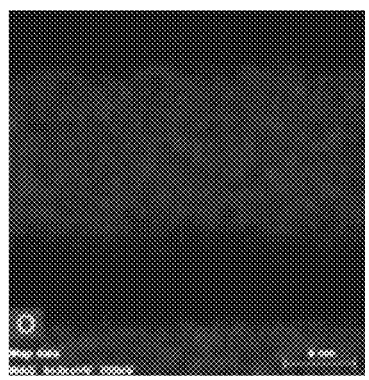
Figure 7C:
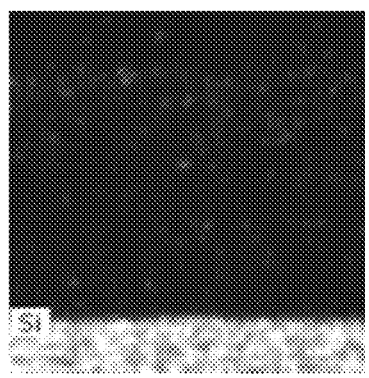
Figure 7D:
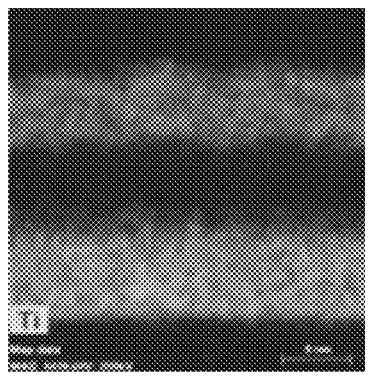
Figure 7E:
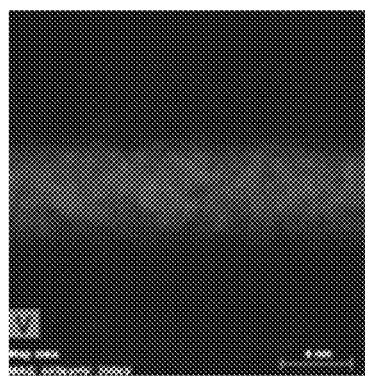

Referring to FIGS. 7A to 7E, FIG. 7A shows a distribution of a nitrogen (N) element; FIG. 7B shows a distribution of an oxygen (O) element; FIG. 7C shows a distribution of a silicon (Si) element; FIG. 7D shows a distribution of a titanium (Ti) element; and FIG. 7E shows a distribution of a vanadium (V) element. Referring to FIGS. 6 and 7A to 7E, it may be confirmed that the rutile phase dielectric layer 120 having a homogeneous crystal structure is grown on the second lower electrode layer 112 including vanadium oxide. In addition, referring to FIGS. 7A to 7E, it may be confirmed that there is almost no inter-diffusion problem between the second lower electrode layer 112 including vanadium oxide and the dielectric layer 120 including TiO$_2$.

Figure 8:
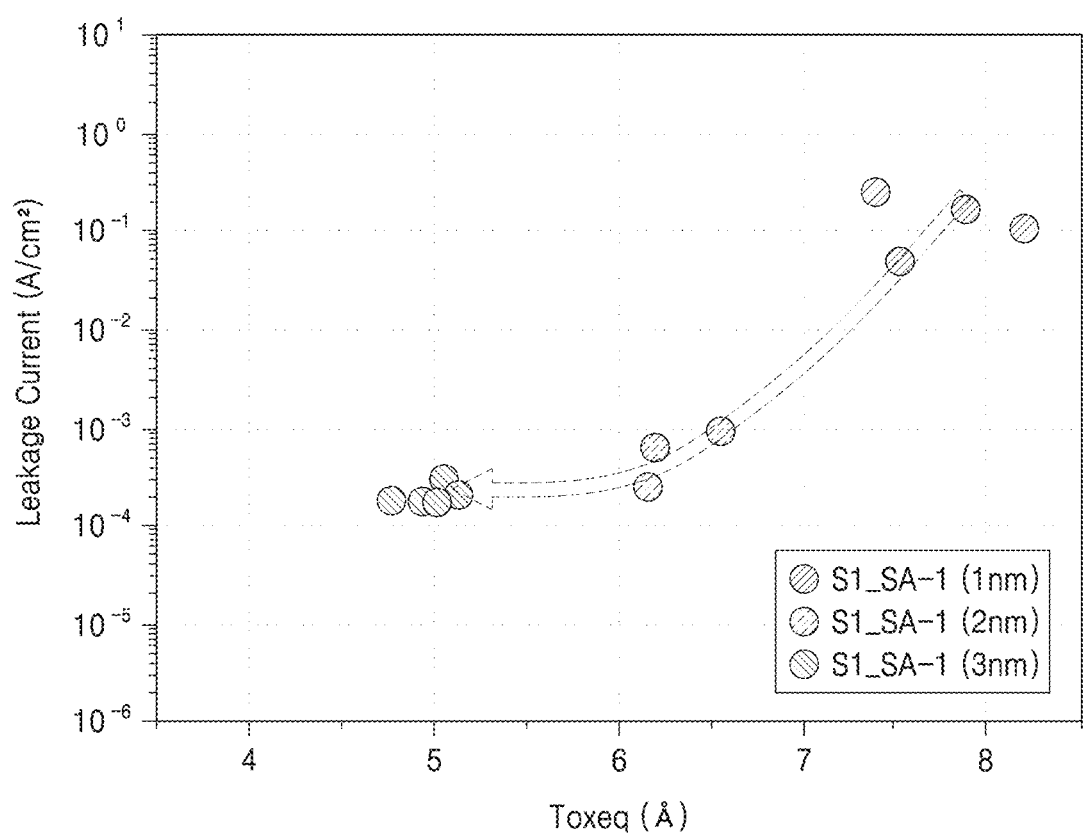
FIG. 8 shows leakage current characteristics of some examples of the capacitor illustrated in FIG. 6.

FIG. 8 shows leakage current characteristics of some examples of the capacitor illustrated in FIG. 6. In the graph of FIG. 8, the vertical axis represents a leakage current and the horizontal axis represents an equivalent oxide thickness (Toxeq or EOT). As the examples, a plurality of capacitors in which the first lower electrode layer 111 included TiN and the second lower electrode layer 112 included VO$_2$ having a thickness of 1 nm, 2 nm, and 3 nm were manufactured and tested. Referring to FIG. 8, it may be confirmed that as the thickness of the second lower electrode layer 112 increases, the EOT decreases and the leakage current decreases.

Figure 9:
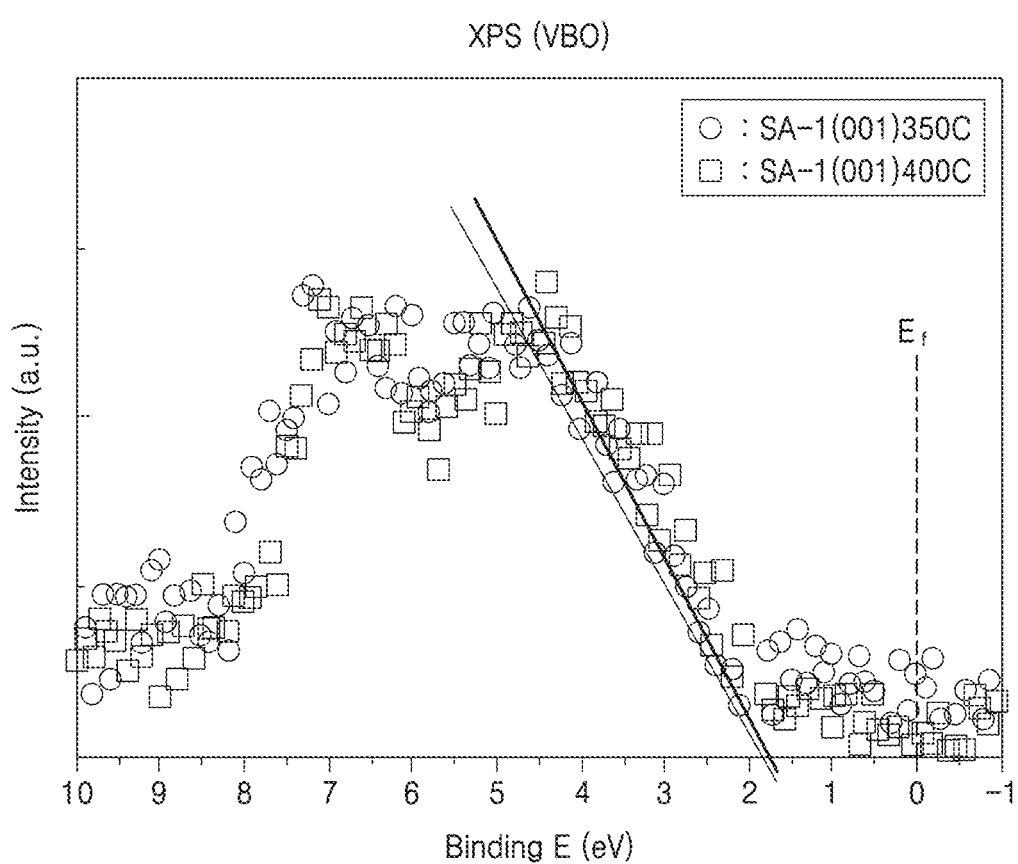
FIG. 9 is a graph showing a relationship between binding energy measured by X-ray photoelectron spectroscopy (XPS) and XPS spectral intensity for capacitors according to some examples.

FIG. 9 is a graph showing a relationship between binding energy measured by X-ray photoelectron spectroscopy (XPS) and XPS spectral intensity for the capacitors according to some examples. As the examples, a plurality of capacitors in which the first lower electrode layer 111 included TiN and the second lower electrode layer 112 included VO$_2$ formed by PLD at a temperature of 350° C. and 400° C. were manufactured and tested. Referring to FIG. 9, it may be confirmed that a valence band offset (VBO) between the second lower electrode layer 112 and the dielectric layer 120 is about 1.75 eV. It may be confirmed that because the bandgap of the dielectric layer 120 is about 3 eV, the CBO of about 1.25 eV or more may be secured between the second lower electrode layer 112 and the dielectric layer 120.

Figure 10:
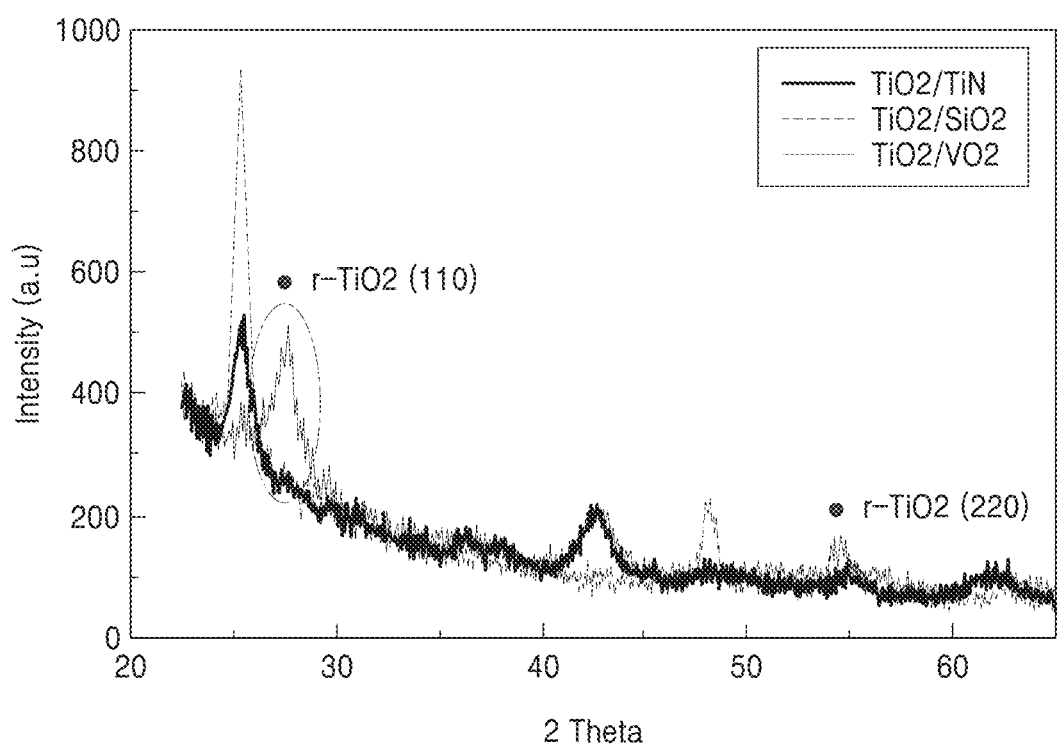
FIG. 10 is a grazing incidence X-ray diffraction (Gi-XRD) analysis result showing that rutile phase $TiO_2$ is grown on vanadium oxide.

FIG. 10 is a grazing incidence X-ray diffraction (Gi-XRD) analysis result showing that rutile phase TiO$_2$ is grown on vanadium oxide. VO$_2$ was used as vanadium oxide. TiO$_2$ was formed on vanadium oxide by ALD. In addition, for comparison, TiO$_2$ was formed on TiN and SiO$_2$ by ALD. In an XRD pattern for TiO$_2$, the rutile phase has characteristics peaks at 27.7° and 54.2° (which are associated with the (110) and (220) planes of the rutile phase, respectively), while the anatase phase has characteristics peaks at 25.3° and 48.3° (which are associated with the (101) and (200) planes of the anatase phase, respectively). Referring to FIG. 10, it may be confirmed that rutile TiO$_2$ is grown on vanadium oxide, and that the rutile phase TiO$_2$ was not formed on TiN and SiO$_2$.

As described above, in the case of the capacitors according to the examples, a rutile phase dielectric material may be formed on a lower electrode having a multilayer structure including a transition metal oxide or a transition metal nitride by ALD. Accordingly, the disclosed capacitors may be miniaturized and also have high capacitance. In addition, because the material of the lower electrode is chemically stable, the material of the lower electrode is unlikely to be reduced to a metal in a subsequent process. In addition, the use of the lower electrode having the multilayer structure may reduce the leakage current.

The capacitor may be employed in various electronic devices. For example, the capacitor may be used as a dynamic random access memory (DRAM) together with a transistor. In addition, the capacitor may be used for a portion of an electronic circuit constituting an electronic device together with other circuit elements.

Figure 11:
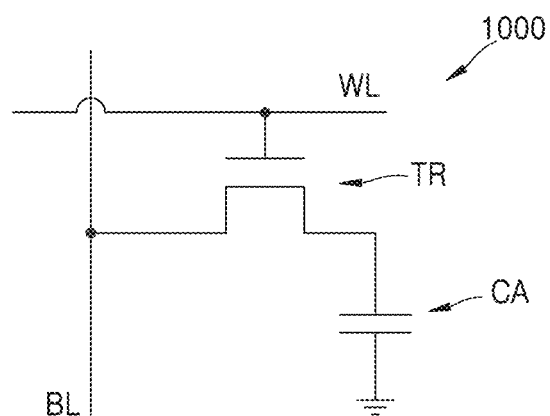
FIG. 11 is a circuit diagram for describing a schematic circuit configuration and operation of an electronic device employing a capacitor, according to at least one embodiment.

FIG. 11 is a circuit diagram for describing a schematic circuit configuration and operation of an electronic device 1000 employing a capacitor, according to some embodiments.

The circuit diagram of the electronic device 1000 is for one cell of a DRAM, and the electronic device 1000 includes one transistor TR, one capacitor CA, a word line WL, and a bit line BL. Though not illustrated (for clarity), the electronic device 1000 may include a plurality of cells, for example arranged in array. The capacitor CA may be the capacitors 100 described with reference to FIGS. 1 to 10.

A method of writing data to the DRAM is as follows. After a gate voltage (high) for turning the transistor TR on ("ON" state) is applied to a gate electrode through the word line WL, a positive supply voltage (VDD (hereinafter, a high voltage)) or ground voltage (VSS or 0 (hereinafter, a low voltage)), which is a data voltage value to be input, is applied to the bit line BL. When a high voltage is applied to the word line WL and the bit line BL, the capacitor CA is charged (e.g., data "1" is written). When a high voltage is applied to the word line WL and a low voltage is applied to the bit line BL, the capacitor CA is discharged (e.g., data "0" is written).

Upon reading data, a high voltage is applied to the word line WL to turn on the transistor TR of the DRAM, and a voltage of VDD/2 is applied to the bit line BL. When the data of the DRAM is "1," that is, when the voltage of the capacitor CA is VDD, charges stored in the capacitor CA slowly move to the bit line BL and the voltage of the bit line BL becomes slightly higher than VDD/2. In contrast, when the data of capacitor CA is "0," charges of the bit line BL move to the capacitor CA and the voltage of the bit line BL becomes slightly lower than VDD/2. In at least one embodiment, a sense amplifier may sense and amplify the potential difference of the bit line and determine whether the data is "0" or "1."

Figure 12:
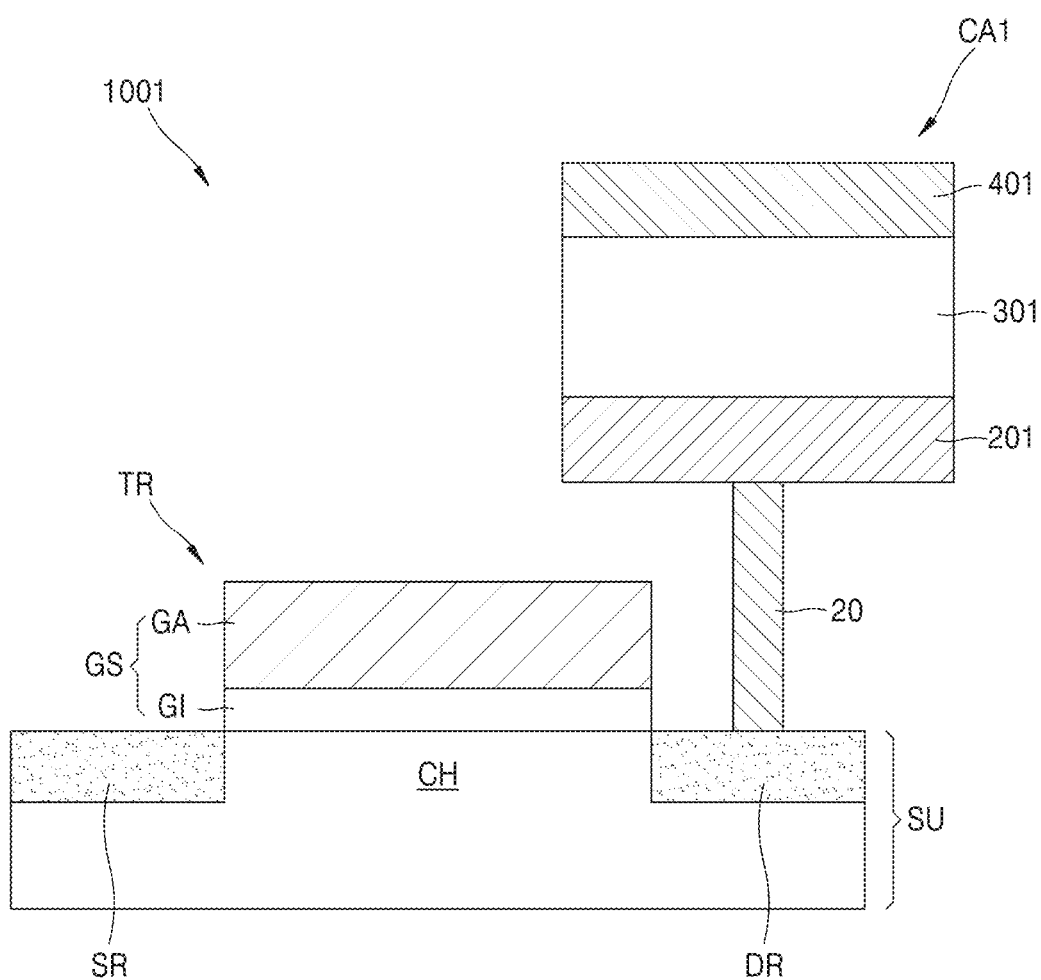
FIG. 12 is a schematic diagram illustrating an electronic device according to at least one embodiment.

FIG. 12 is a schematic diagram illustrating an electronic device 1001 according to at least one embodiment. For clarity, FIG. 12 illustrates one capacitor CA1 and one transistor TR for the electronic device 1001; however, the electronic device 1001 may include a plurality of capacitors and a plurality of transistors, arranged in, e.g., an array.

Referring to FIG. 12, the electronic device 1001 may include a structure in which the capacitor CA1 and the transistor TR are electrically connected to each other through a contact 20. The capacitor CA1 includes a lower electrode 201, an upper electrode 401, and a dielectric thin film 301 located between the lower electrode 201 and the upper electrode 401. The capacitor CA1 may be the capacitors 100 described with reference to FIGS. 1 to 10. For example, in at least one embodiment, the lower electrode 201 may be the same as the lower electrode 110 of FIG. 1. Because this has been described above, detailed descriptions thereof are omitted.

The transistor TR may be a field effect transistor. The transistor TR includes a semiconductor substrate SU and a gate stack GS. The semiconductor substrate SU includes a source region SR, a drain region DR, and a channel region CH. The gate stack GS is disposed on the semiconductor substrate SU, faces the channel region CH, and includes a gate insulating layer GI and a gate electrode GA.

The channel region CH is a region between the source region SR and the drain region DR, and is electrically connected to the source region SR and the drain region DR. The source region SR may be electrically connected to and/or in contact with one end of the channel region CH, and the drain region DR may be electrically connected to and/or in contact with the other end of the channel region CH. In at least one embodiment, the channel region CH may be a substrate region between the source region SR and the drain region DR in the semiconductor substrate SU.

The semiconductor substrate SU may include a semiconductor material. The semiconductor substrate SU may include, for example, an elemental and/or compound semiconductor material, such as silicon (Si), germanium (Ge), silicon germanium (SiGe), silicon carbide (SiC), gallium arsenide (GaAs), indium arsenide (InAs), indium phosphide (InP), and/or the like. In addition, the semiconductor substrate SU may include a silicon on insulator (SOI) substrate.

The source region SR, the drain region DR, and the channel region CH may each independently be formed by implanting impurities into different regions of the semiconductor substrate SU. In this case, the source region SR, the channel region CH, and the drain region DR may each include a substrate material as a base material. The source region SR and the drain region DR may each also include a conductive material. In this case, the source region SR and the drain region DR may each include, for example, a metal, a metal compound, a conductive polymer, and/or the like.

In at least one embodiment, the channel region CH may be implemented as a separate material layer (thin film), unlike the illustration thereof. In this case, for example, the channel region CH may include at least one of Si, Ge, SiGe, a Group III-V semiconductor, an oxide semiconductor, a nitride semiconductor, an oxynitride semiconductor, a two-dimensional (2D) material, a quantum dot (QD), an organic semiconductor, and/or the like. For example, the oxide semiconductor may include InGaZnO or the like, the 2D material may include transition metal dichalcogenide (TMD) or graphene, and the QD may include a colloidal QD and/or a nanocrystal structure.

The gate electrode GA may be disposed on the semiconductor substrate SU to face the channel region CH while being spaced apart from the semiconductor substrate SU. The gate electrode GA may include a conductive material, such as at least one of a metal, a metal nitride, a metal carbide, and polysilicon. For example, the metal may include at least one of aluminum (Al), tungsten (W), molybdenum (Mo), titanium (Ti), tantalum (Ta), and/or the like; and the metal nitride may include at least one of titanium nitride (TiN), tantalum nitride (TaN), and/or the like. The metal carbide may include at least one of aluminum-doped (or aluminum-containing) metal carbide, silicon-doped (or silicon-containing) metal carbide, and/or the like. Specific examples of the metal carbide include, e.g., TiAlC, TaAlC, TiSiC, and/or TaSiC.

The gate electrode GA may have a structure in which a plurality of materials are stacked. For example, the gate electrode GA may have a structure (e.g., TiN/Al) in which a metal nitride layer and a metal layer are stacked, or a structure (e.g., TiN/TiAlC/W) in which a metal nitride layer, a metal carbide layer, and a metal layer are stacked. However, the materials described above are only an example, and the gate electrode GA stack may include conductive materials not listed above.

The gate insulating layer GI may be further arranged between the semiconductor substrate SU and the gate electrode GA. The gate insulating layer GI may include a paraelectric material or a high-κ dielectric material and, in at least one embodiment, may have a dielectric constant of about 20 to about 70.

The gate insulating layer GI may include an electrically insulative material such as silicon oxide, silicon nitride, aluminum oxide, hafnium oxide, zirconium oxide, a 2D insulator (such as hexagonal boron nitride (h-BN)) and/or the like. For example, the gate insulating layer GI may include silicon oxide ($SiO_2$), silicon nitride ($SiN_x$), or the like, and/or may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate ($PbZnNbO_3$), and/or the like. In addition, the gate insulating layer GI may include metal nitride oxide (e.g., aluminum oxynitride (AlON), zirconium oxynitride (ZrON), hafnium oxynitride (HfON), lanthanum oxynitride (LaON), yttrium oxynitride (YON), etc.), silicate (e.g., ZrSiON, HfSiON, YSiON, LaSiON, etc.), aluminate (e.g., ZrAlON, HfAlON, etc.), and/or the like. In addition, in at least one embodiment, the gate insulating layer GI may include the dielectric layer 120 described above. The gate insulating layer GI may constitute a gate stack together with the gate electrode GA.

One of the lower electrode 201 and the upper electrode 401 of the capacitor CA1 and one of the source region SR and the drain region DR of the transistor TR may be electrically connected to each other through the contact 20. The contact 20 may include an appropriate conductive material, for example, tungsten, copper, aluminum, polysilicon, and/or the like.

The arrangement of the capacitor CA1 and the transistor TR may be variously modified. For example, the capacitor CA1 may be disposed on the semiconductor substrate SU or may be buried in the semiconductor substrate SU.

Figure 13:
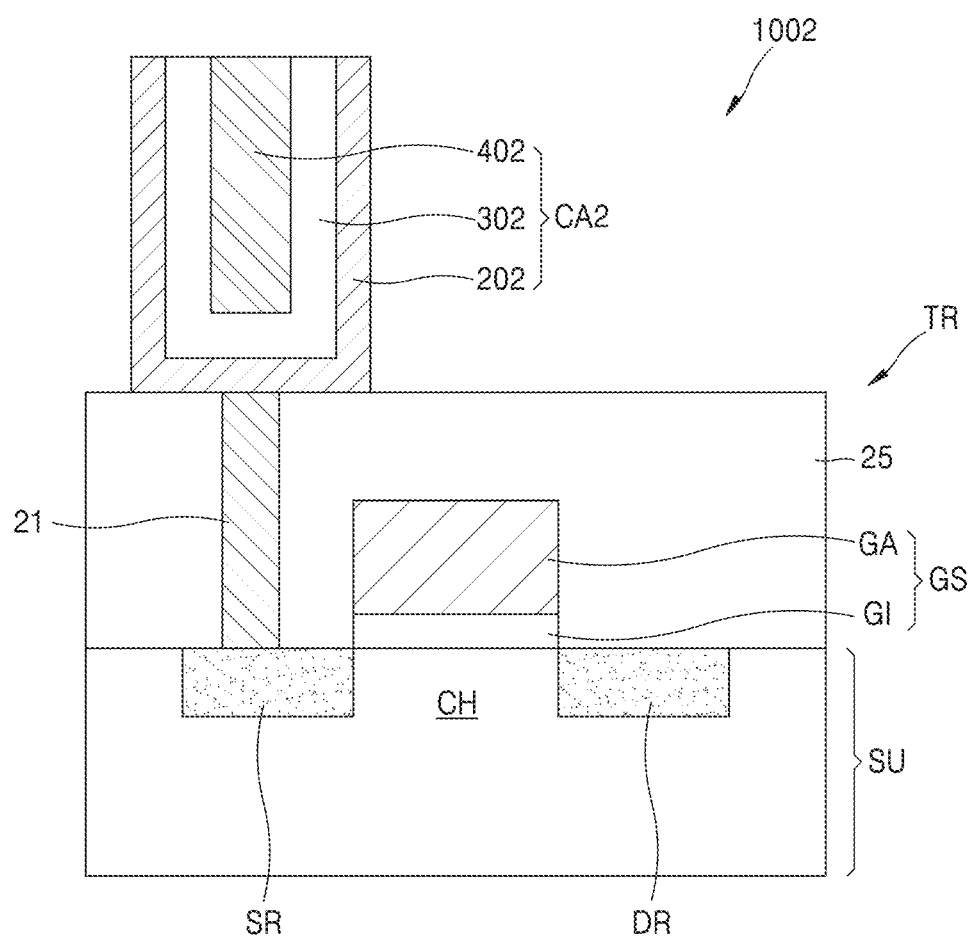
FIG. 13 is a schematic diagram illustrating an electronic device according to at least one embodiment.

FIG. 13 is a schematic diagram illustrating an electronic device 1002 according to at least one embodiment. For clarity, FIG. 13 illustrates one capacitor CA2 and one transistor TR for the electronic device 1002; however, the electronic device 1002 may include a plurality of capacitors and a plurality of transistors, arranged in, e.g., an array of cells.

Referring to FIG. 13, the electronic device 1002 may include a structure in which the capacitor CA2 and the transistor TR are electrically connected to each other through a contact 21. The transistor TR includes a semiconductor substrate SU and a gate stack GS. The semiconductor substrate SU includes a source region SR, a drain region DR, and a channel region CH. The gate stack GS is disposed on the semiconductor substrate SU, faces the channel region CH, and includes a gate insulating layer GI and a gate electrode GA.

An interlayer insulating layer 25 may be provided on the semiconductor substrate SU to cover the gate stack GS. The interlayer insulating layer 25 may include an insulating material. For example, the interlayer insulating layer 25 may include Si oxide (e.g., $SiO_2$), Al oxide (e.g., $Al_2O_3$), a high-κ material (e.g., $HfO_2$), and/or the like. The contact 21 passes through the interlayer insulating layer 25 to electrically connect the transistor TR to the capacitor CA2.

The capacitor CA2 includes a lower electrode 202, an upper electrode 402, and a dielectric thin film 302 located between the lower electrode 202 and the upper electrode 402. The lower electrode 202 and the upper electrode 402 are provided in a shape selected to increase (or maximize) the contact area with the dielectric thin film 302, and the materials of the capacitor CA2 and the transistor TR are substantially the same as the material of the capacitors 100 described with reference to FIGS. 1 to 10 and the electronic device 1001 described with reference to FIG. 12.

Figure 14:
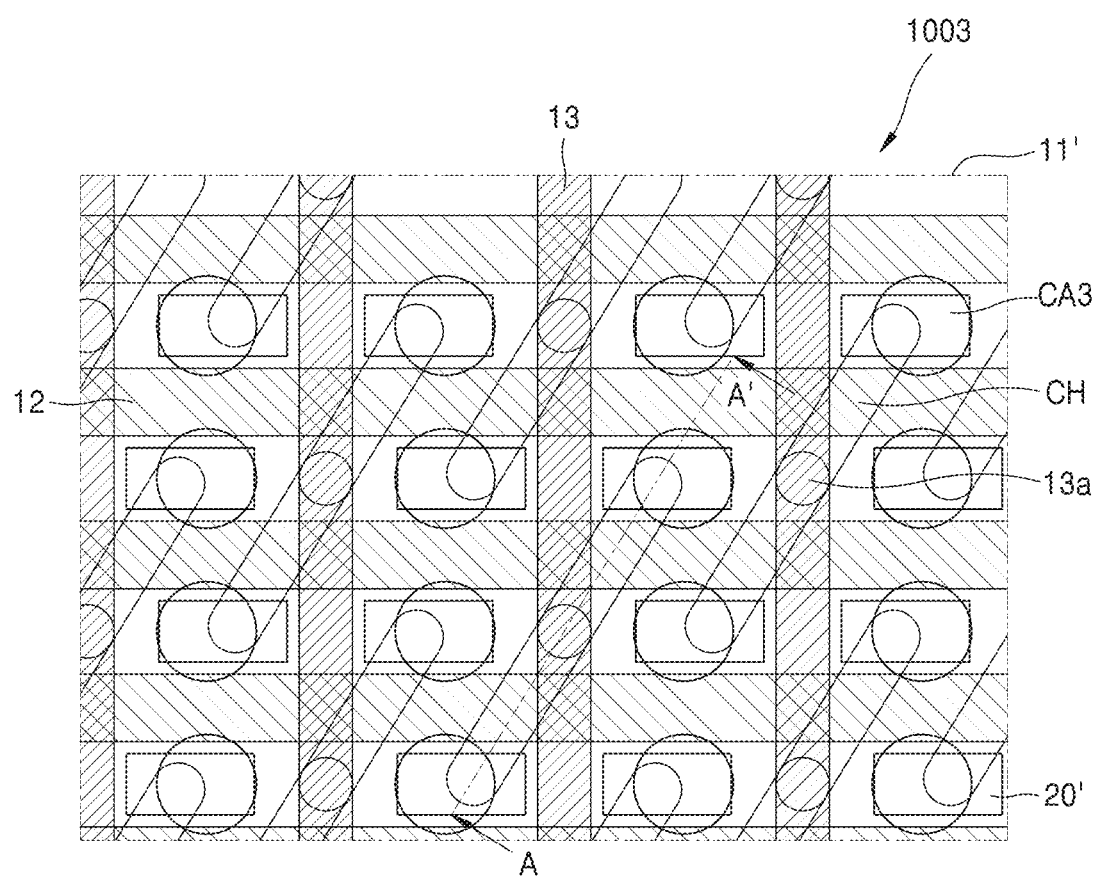
FIG. 14 is a plan view illustrating an electronic device according to at least one embodiment.
Figure 14:
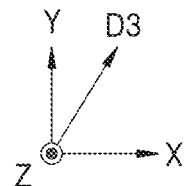

FIG. 14 is a plan view illustrating an electronic device 1003 according to another embodiment.

Referring to FIG. 14, the electronic device 1003 may include a structure in which a plurality of capacitors and a plurality of field effect transistors are repeatedly arranged. Each of the plurality of capacitors may be included as part of a cell with a corresponding field effect transistor. For example, a cell of the electronic device 1003 may include a field effect transistor, a contact structure 20', and a capacitor CA3. The field effect transistor includes a semiconductor substrate 11' including a source, a drain, and a channel, and a gate stack 12. The contact structure 20' is disposed on the semiconductor substrate 11' so as not to overlap the gate stack 12. The capacitor CA3 is disposed on the contact structure 20'. The electronic device 1003 may further include a bit line structure 13 electrically connecting the field effect transistors to each other.

Although FIG. 14 illustrates that both the contact structure 20' and the capacitor CA3 are repeatedly arranged in the X and Y directions, the disclosure is not limited thereto. For example, the contact structure 20' may be arranged in the X and Y directions, and the capacitor CA3 may be arranged in a hexagonal shape, such as a honeycomb structure.

Figure 15:
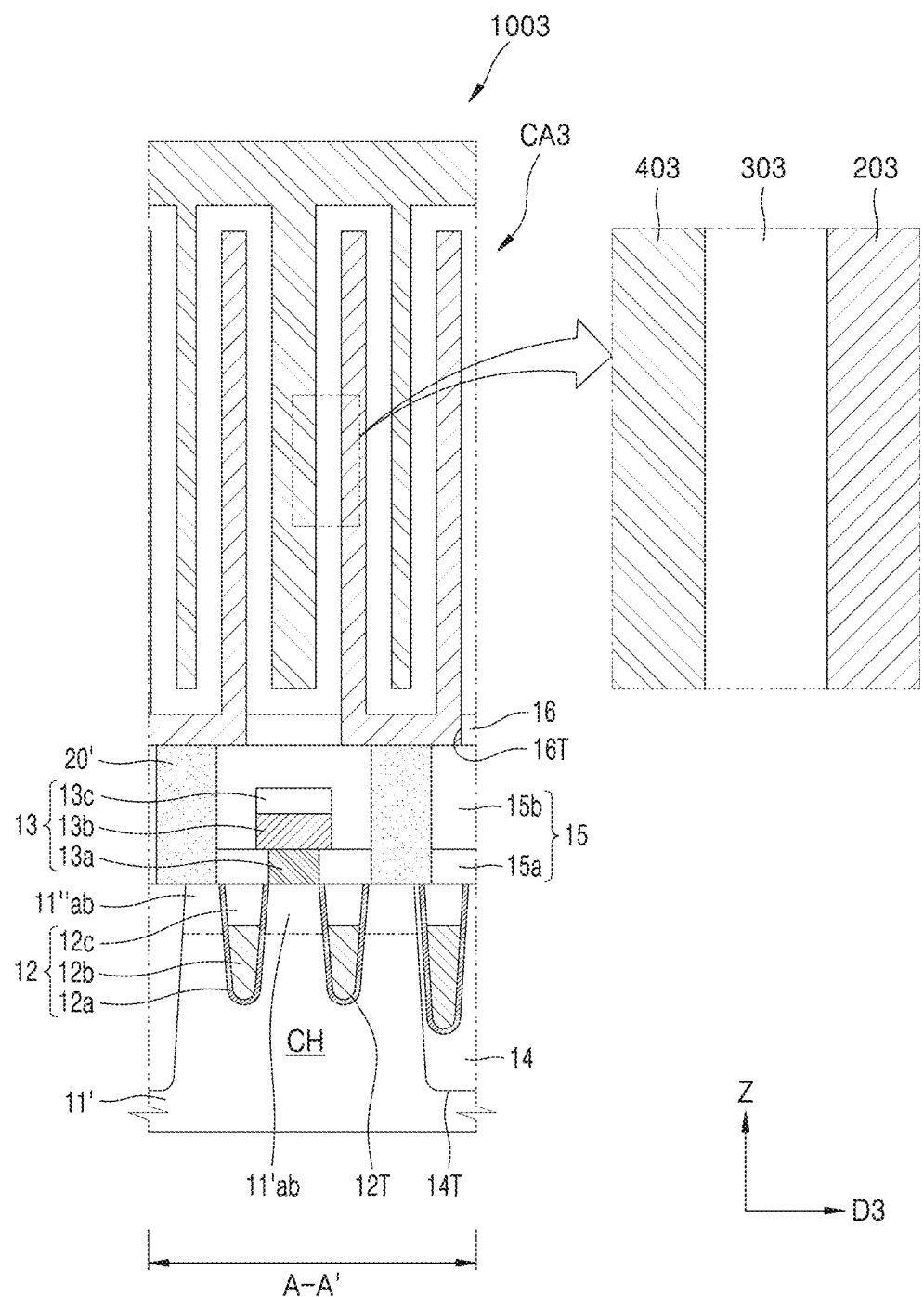
FIG. 15 is a cross-sectional view of the electronic device taken along line A-A' of FIG. 12.

FIG. 15 is a cross-sectional view of the electronic device 1003 taken along line A-A' of FIG. 14.

Referring to FIG. 15, the semiconductor substrate 11' may have a shallow trench isolation (STI) structure including a device isolation layer 14. The device isolation layer 14 may be a single layer including one type of insulating layer, or multiple layers including a combination of two or more types of insulating layers. The device isolation layer 14 may include a device isolation trench 14T in the semiconductor substrate 11', and the device isolation trench 14T may be filled with an insulating material. The insulating material may include, for example, at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and/or tonen silazene (TOSZ), but the disclosure is not limited thereto.

The semiconductor substrate 11' may further include a channel region CH defined by the device isolation layer 14, and a gate line trench 12T parallel to the upper surface of the semiconductor substrate 11' and extending in the X direction. The channel region CH may have a relatively long island shape having a minor axis and a major axis. The major axis of the channel region CH may be arranged in a D3 direction parallel to the upper surface of the semiconductor substrate 11', as illustrated in FIG. 14.

The gate line trench 12T may be arranged to cross the channel region CH at a certain depth from the upper surface of the semiconductor substrate 11', or may be arranged inside the channel region CH. The gate line trench 12T may also be arranged inside the device isolation trench 14T. The gate line trench 12T inside the device isolation trench 14T may have a lower bottom surface than that of the gate line trench 12T of the channel region CH. A first source/drain 11'ab and a second source/drain 11"ab may be arranged in an upper portion of the channel region CH located at both sides of the gate line trench 12T.

The gate stack 12 may be arranged inside the gate line trench 12T. Specifically, a gate insulating layer 12a, a gate electrode 12b, and a gate capping layer 12c may be sequentially arranged inside the gate line trench 12T. The gate insulating layer 12a and the gate electrode 12b may be the same as described above, and the gate capping layer 12c may include an insulating material, such as at least one of silicon oxide, silicon oxynitride, silicon nitride, and/or the like. The gate capping layer 12c may be arranged on the gate electrode 12b to fill the remaining portion of the gate line trench 12T.

A bit line structure 13 may be disposed on the first source/drain 11'ab. The bit line structure 13 may be arranged parallel to the upper surface of the semiconductor substrate 11' and extend in the Y direction. The bit line structure 13 may be electrically connected to the first source/drain 11'ab, and may include a bit line contact 13a, a bit line 13b, and a bit line capping layer 13c, which are sequentially stacked on the substrate. For example, the bit line contact 13a may include polysilicon, the bit line 13b may include a metal material, and the bit line capping layer 13c may include an insulating material, such as silicon nitride or silicon oxynitride.

Although FIG. 15 illustrates that the bit line contact 13a has a bottom surface at the same level as the upper surface of the semiconductor substrate 11', this is only an example and the disclosure is not limited thereto. For example, in another example, a recess formed to a certain depth from the upper surface of the semiconductor substrate 11' may be further provided. The bit line contact 13a may extend to the inside of the recess so that the bottom surface of the bit line contact 13a is lower than the upper surface of the semiconductor substrate 11'.

The bit line structure 13 may further include a bit line intermediate layer (not illustrated) between the bit line contact 13a and the bit line 13b. The bit line intermediate layer may include metal silicide, such as tungsten silicide, or metal nitride, such as tungsten nitride. In addition, a bit line spacer (not illustrated) may be further formed on a sidewall of the bit line structure 13. The bit line spacer may have a single-layer structure or a multilayer structure, and may include an insulating material, such as silicon oxide, silicon oxynitride, silicon nitride, and/or the like. In addition, the bit line spacer may further include an air space (not illustrated).

The contact structure 20' may be disposed on the second source/drain 11"ab. The contact structure 20' and the bit line structure 13 may be disposed on different sources/drains on the substrate. The contact structure 20' may have a structure in which a lower contact pattern (not illustrated), a metal silicide layer (not illustrated), and an upper contact pattern (not illustrated) are sequentially stacked on the second source/drain 11"ab. The contact structure 20' may further include a barrier layer (not illustrated) surrounding the side surface and the bottom surface of the upper contact pattern. For example, the lower contact pattern may include polysilicon, the upper contact pattern may include a metal material, and the barrier layer may include a conductive metal nitride.

The capacitor CA3 may be disposed on the semiconductor substrate 11' and electrically connected to the contact structure 20'. Specifically, the capacitor CA3 includes a lower electrode 203 electrically connected to the contact structure 20', an upper electrode 403 apart from the lower electrode 203, and a dielectric thin film 303 between the lower electrode 203 and the upper electrode 403. The lower electrode 203 may have a cylindrical shape or a cup shape having an internal space with a closed bottom. The upper electrode 403 may have a comb shape having comb teeth extending into an internal space formed by the lower electrode 203 and a region between the adjacent lower electrodes 203. The dielectric thin film 303 may be arranged between the lower electrode 203 and the upper electrode 403 so as to be parallel to the surfaces of the lower electrode 203 and the upper electrode 403.

Because materials of the lower electrode 203, the dielectric thin film 303, and the upper electrode 403 constituting the capacitor CA3 are substantially the same as those of the capacitors 100 described with reference to FIGS. 1 to 10. For example, in at least one embodiment, the lower electrode 203 may be the same as the lower electrode 110 of FIG. 1. Because this has been described above, detailed descriptions thereof are omitted.

An interlayer insulating layer 15 may be further arranged between the capacitor CA3 and the semiconductor substrate 11'. The interlayer insulating layer 15 may be arranged in a space between the capacitor CA3 and the semiconductor substrate 11', in which other structures are not arranged. Specifically, the interlayer insulating layer 15 may be arranged to cover a wiring and/or electrode structure, such as the bit line structure 13, the contact structure 20', and the gate stack 12 on the substrate. For example, the interlayer insulating layer 15 may surround a wall of the contact structure 20'. The interlayer insulating layer 15 may include a first interlayer insulating layer 15a surrounding the bit line contact 13a, and a second interlayer insulating layer 15b covering the side surfaces and/or the upper surfaces of the bit line 13b and the bit line capping layer 13c.

The lower electrode 203 of the capacitor CA3 may be arranged on the interlayer insulating layer 15, specifically on the second interlayer insulating layer 15b. In addition, when a plurality of capacitors CA3 are arranged, bottom surfaces of a plurality of lower electrodes 203 may be separated from each other by an etch stop layer 16. In other words, the etch stop layer 16 may include an opening 16T, and the bottom surface of the lower electrode 203 of the capacitor CA3 may be arranged in the opening 16T. As illustrated, the lower electrode 203 may have a cylindrical shape or a cup shape having an internal space with a closed bottom. The capacitor CA3 may further include a support (not illustrated) that prevents the lower electrode 203 from being tilted or collapsed. The support may be disposed on the sidewall of the lower electrode 203.

Figure 16:
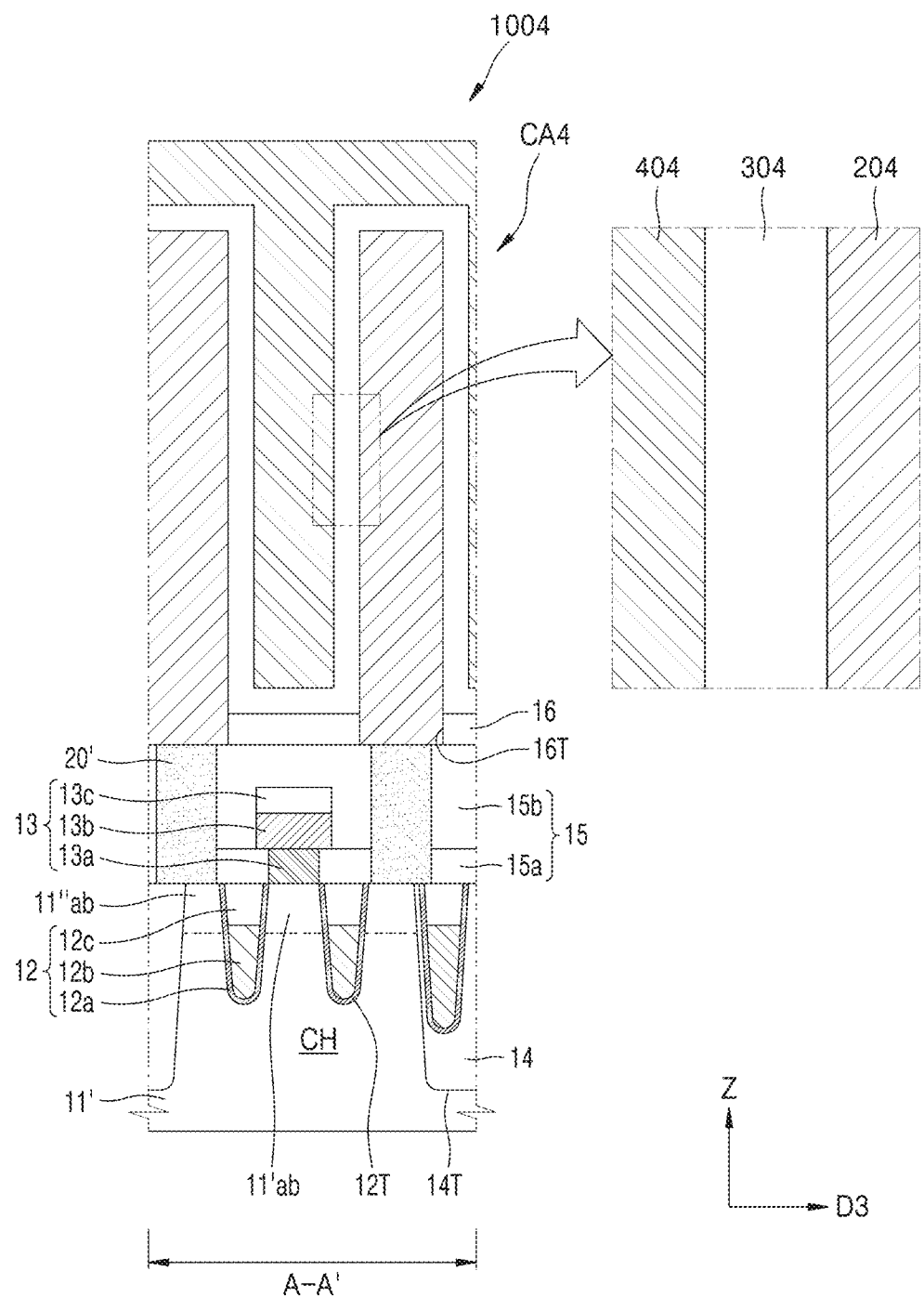
FIG. 16 is a cross-sectional view illustrating an electronic device according to at least one embodiment.

FIG. 16 is a cross-sectional view illustrating an electronic device 1004, according to at least one embodiment.

The cross-sectional view of the electronic device 1004, according to the present embodiment, corresponds to the cross-sectional view taken along line A-A' of FIG. 14, and the electronic device 1004 of FIG. 16 differs from the electronic device 1003 of FIG. 15 only in a shape of a capacitor CA4. The capacitor CA4 is disposed on a semiconductor substrate 11' and electrically connected to a contact structure 20'. The capacitor CA4 includes a lower electrode 204 electrically connected to the contact structure 20', an upper electrode 404 apart from the lower electrode 204, and a dielectric thin film 304 between the lower electrode 204 and the upper electrode 404. Materials of, e.g., the lower electrode 204, the dielectric thin film 304, and the upper electrode 404 are the same as those of the capacitors 100 described with reference to FIGS. 1 to 10.

The lower electrode 204 may have a pillar shape, such as a cylinder, a square pillar, or an otherwise polygonal pillar, which extends in the vertical direction (Z direction). The upper electrode 404 may have a comb shape having comb teeth extending into a region between the adjacent lower electrodes 204. The dielectric thin film 304 may be arranged between the lower electrode 204 and the upper electrode 404 to be parallel to the surfaces of the lower electrode 204 and the upper electrode 404.

The capacitors and the electronic devices, according to the embodiments described above, may be applied to various application fields. For example, the electronic devices according to the embodiments, may be applied as logic devices or memory devices. The electronic devices according to the embodiments, may be used for arithmetic operations, program execution, temporary data retention, and the like in devices such as mobile devices, computers, laptop computers, sensors, network devices, and neuromorphic devices. In addition, the electronic devices according to the embodiments, may be useful for devices in which an amount of data transmission is large and data transmission is continuously performed.

Figure 17:
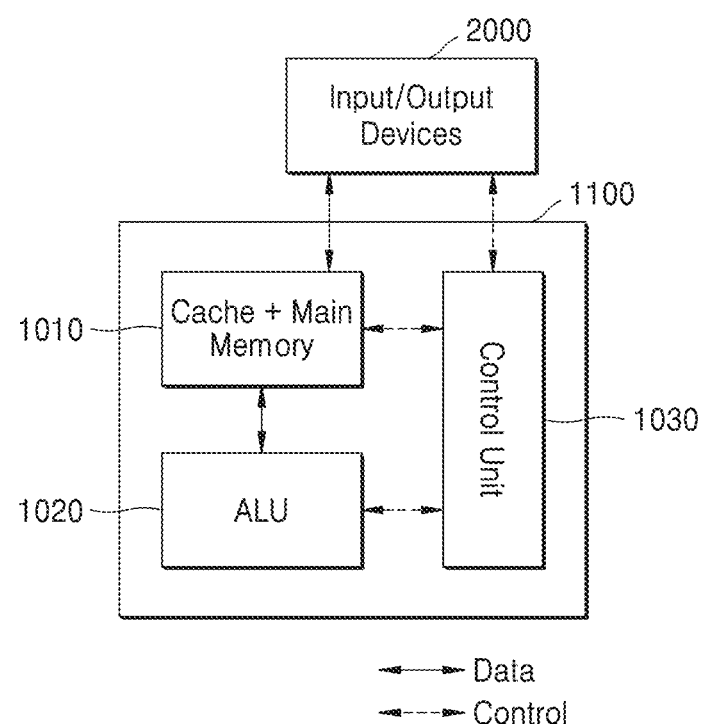
FIGS. 17 and 18 are conceptual diagrams schematically illustrating device architectures applicable to a device according to at least some embodiments.
Figure 18:
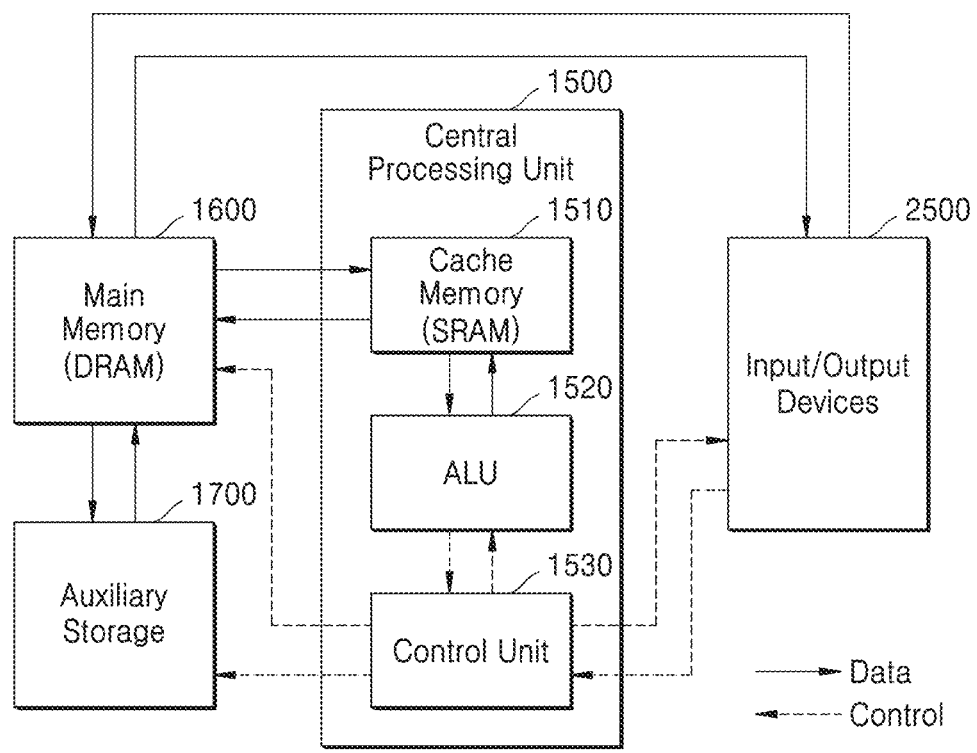

FIGS. 17 and 18 are conceptual diagrams schematically illustrating device architectures applicable to a device, according to at least some embodiments.

Referring to FIG. 17, an electronic device architecture 1100 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1100 may be implemented as a single chip including the memory unit 1010, the ALU 1020, and the control unit 1030.

The memory unit 1010, the ALU 1020, and the control unit 1030 may be interconnected in an on-chip manner via a metal line to perform direct communication. The memory unit 1010, the ALU 1020, and the control unit 1030 may be monolithically integrated on a single substrate to constitute a single chip. Input/output devices 2000 may be connected to the electronic device architecture (chip) 1100. In addition, the memory unit 1010 may include both a main memory and a cache memory. The electronic device architecture (chip) 1100 may be an on-chip memory processing unit. The memory unit 1010 may include the capacitor and the electronic device including the same, which have been described above. The ALU 1020 or the control unit 1030 may also include the capacitor described above.

Referring to FIG. 18, a cache memory 1510, an ALU 1520, and a control unit 1530 may constitute a central processing unit (CPU) 1500. The cache memory 1510 may include a static random access memory (SRAM). Apart from the CPU 1500, a main memory 1600 and an auxiliary storage 1700 may be provided. The main memory 1600 may be a DRAM and may include the capacitor described above. In some cases, the electronic device architecture may be implemented in a form in which computing unit elements and memory unit elements are adjacent to each other on a single chip, without distinction of sub-units.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
a lower electrode;
an upper electrode facing the lower electrode; and
a dielectric layer separating the lower electrode and the upper electrode,
wherein the dielectric layer includes $TiO_2$ having a rutile phase, and further includes at least one of gallium (Ga), aluminum (Al), lanthanum (La), boron (B), indium (In), scandium (Sc), or yttrium (Y), in an amount (y) such that 0 at %<y≤10 at %,
the lower electrode comprises a first lower electrode layer spaced apart from the dielectric layer and a second lower electrode layer separating the first lower electrode layer and the dielectric layer, and
the second lower electrode layer includes vanadium oxide.

2. The capacitor of claim 1, wherein the vanadium oxide of the second lower electrode layer includes a crystal of at least one of $VO_2$, $V_2O_5$, or $VO_3$.

3. The capacitor of claim 2, wherein the second lower electrode layer is doped with at least one of tungsten (W), tantalum (Ta), or niobium (Nb).

4. The capacitor of claim 1, wherein the second lower electrode layer has a thickness of 10 nm or less.

5. The capacitor of claim 1, wherein the first lower electrode layer includes at least one of TiN, VN, MON, and $SnO_2$.

6. The capacitor of claim 5, wherein the first lower electrode layer includes the $SnO_2$, and
the $SnO_2$ includes at least one of tungsten (W), tantalum (Ta), niobium (Nb), antimony (Sb), manganese (Mn), fluorine (F), $RuO_2$, $IrO_2$, or $MoO_2$ as a dopant.

7. The capacitor of claim 6, wherein the dopant in the first lower electrode layer is included in an amount (x) such that 0.01 at %≤x≤10 at %.

8. The capacitor of claim 1, wherein the dielectric layer has a thickness of 20 nm or less.

9. The capacitor of claim 1, wherein the dielectric layer has a dielectric constant of 50 or more.

10. An electronic device comprising:
a transistor; and
a capacitor electrically connected to the transistor,
wherein the capacitor comprises
a lower electrode,
an upper electrode facing the lower electrode, and
a dielectric layer separating the lower electrode and the upper electrode,
wherein the dielectric layer includes $TiO_2$ having a rutile phase, and further includes at least one of gallium (Ga), aluminum (Al), lanthanum (La), boron (B), indium (In), scandium (Sc), or yttrium (Y), in an amount (y) such that 0 at %<y≤10 at %,
the lower electrode comprises a first lower electrode layer spaced apart from the dielectric layer and a second lower electrode layer separating the first lower electrode layer and the dielectric layer, and
the second lower electrode layer includes vanadium oxide.

11. The electronic device of claim 10, wherein the vanadium oxide of the second lower electrode layer includes a crystal of at least one of $VO_2$, $V_2O_5$, or $VO_3$.

12. The electronic device of claim 11, wherein the second lower electrode layer is doped with at least one of tungsten (W), tantalum (Ta), or niobium (Nb).

13. The electronic device of claim 10, wherein the second lower electrode layer has a thickness of 10 nm or less.

14. The electronic device of claim 10, wherein the first lower electrode layer includes at least one of TiN, VN, MON, or $SnO_2$.

15. The electronic device of claim 14, wherein the first lower electrode layer includes the $SnO_2$, and the $SnO_2$ includes at least one of tungsten (W), tantalum (Ta), niobium (Nb), antimony (Sb), manganese (Mn), fluorine (F), $RuO_2$, $IrO_2$, or $MoO_2$ as a dopant, and the dopant in the first lower electrode layer is included in an amount x) such that 0.01 at %≤x≤10 at %.

16. The electronic device of claim 10, wherein the dielectric layer has a thickness of 20 nm or less and a dielectric constant of 50 or more.

\* \* \* \* \*